(12) United States Patent
Towns et al.

(10) Patent No.: US 6,353,072 B1
(45) Date of Patent: Mar. 5, 2002

(54) POLYMER PREPARATION FROM BORON DERIVATIVE FUNCTIONAL GROUP-CONTAINING MONOMERS

(75) Inventors: Robert Carl Towns, Stansted; Richard O'Dell, Herts, both of (GB)

(73) Assignee: Cambridge Display Technology Limited (GB)

( * ) Notice: Subject to any disclaimer, the term of this patent is extended or adjusted under 35 U.S.C. 154(b) by 0 days.

(21) Appl. No.: 09/518,991

(22) Filed: Mar. 3, 2000

Related U.S. Application Data
(60) Provisional application No. 60/160,953, filed on Oct. 22, 1999.

(30) Foreign Application Priority Data

Mar. 5, 1999 (GB) .............................................. 9905203
Oct. 29, 1999 (GB) ............................................. 9925653

(51) Int. Cl.$^7$ ........................ C08G 79/08; C07K 30/06; C09K 11/06

(52) U.S. Cl. ............................... 528/4; 528/8; 528/394; 528/397; 252/301.16; 252/301.35; 323/902; 430/321

(58) Field of Search ............................... 528/4, 8, 394, 528/397; 252/301.16, 301.35; 323/902; 430/321

(56) References Cited

U.S. PATENT DOCUMENTS

| | | | | |
|---|---|---|---|---|
| 4,857,630 A | * | 8/1989 | Kim ............................ | 528/397 |
| 5,550,236 A | | 8/1996 | Schlosser et al. ............ | 544/238 |
| 5,753,757 A | * | 5/1998 | Hsieh ......................... | 525/195 |
| 5,777,070 A | | 7/1998 | Inbasekaran et al. ....... | 528/394 |
| 6,169,163 B1 | * | 1/2001 | Woo et al. .................. | 528/397 |

FOREIGN PATENT DOCUMENTS

| | | |
|---|---|---|
| DE | 4236103 A1 | 4/1994 |
| WO | WO 00/22026 | 4/2000 |

OTHER PUBLICATIONS

Genet, J.P. et al., "Suzuki–Type Cross Coupling Reactions Using Palladium–Water Soluble Catalyst. Synthesis of Functionalized Dienes," Tetrahedron Letters, NL, Elsevier Science Publishers, Amsterdam, vol. 36, No. 9, Feb. 27, 1995, pp. 1443–1446, XP004028596.

Baumgarten et al., "Synthesis and Optical Properties of Novel Blue Fluorescent Conjugated Polymers," Phys. Chem. Chem. Phys., 1999, pp. 1699–1706.

Goodson et al., "Palladium–Mediated Soluble Precursor Route Into Poly(arylethynylenes) and Poly(arylethylenes)," Macromolecules, vol. 30, No. 20, 1997, pp. 6047–6055.

Miyaura et al., "The Palladium–Catalyzed Cross–Coupling Reaction of Phenylboronic Acid With Haloarenes in the Presence of Bases," Synthetic Communications, vol. 11, No. 7, 1981, pp. 513–519.

\* cited by examiner

*Primary Examiner*—Robert Dawson
*Assistant Examiner*—Jeffrey B. Robertson
(74) *Attorney, Agent, or Firm*—Therese Hendricks; Finnegan, Henderson, Farabow, Garrett & Dunner

(57) ABSTRACT

A process for preparing a conjugated polymer, which comprises polymerizing in a reaction mixture (a) an aromatic monomer having at least two reactive boron derivative groups selected from a boronic acid group, a boronic ester group and a borane group, and an aromatic monomer having at least two reactive halide functional groups; or (b) an aromatic monomer having one reactive halide functional group and one reactive boron derivative group selected from a boronic acid group, a boronic ester group and a borane group, wherein the reaction mixture comprises a catalytic amount of a palladium catalyst, and an organic base in an amount sufficient to convert the reactive boron derivative groups into —$B(OH)_3^-$ anions.

20 Claims, 3 Drawing Sheets

POLYMER PREPARATION FROM BORON DERIVATIVE FUNCTIONAL GROUP-CONTAINING MONOMERS

RELATED CASES

This case claims priority to U.S. Provisional Application No. 60/160,953 filed Oct. 22, 1999.

FIELD OF THE INVENTION

The present invention relates to a process for preparing a polymer such as a conjugated polymer for use in an optical device such as an electroluminescent device.

BACKGROUND OF THE INVENTION

Organic electroluminescent devices are known which employ an organic material for lights emission. For example, WO90/13148 describes such a device comprising a semiconductor layer comprising a polymer film which comprises at least one conjugated polymer situated between electrodes. The polymer film in this case comprises a poly(para-phenylene vinylene) (PPV) film which is capable of light emission when electrons and holes are injected therein. Other polymer layers capable of transporting holes or transporting electrons to the emissive layer may be incorporated into such devices. The bandgap of PPV and other poly(arylene vinylene) polymers may be tuned to modulate the wavelength, quantum efficiency and/or refractive index thereof, as described in EP-A-0544795.

Preparation of poly(arylene vinylene)s for use in optical devices has been conveniently carried out by a precursor route where thermal elimination of leaving groups gives rise to a conjugated polymer, or by other routes such as a dehydrohalogenation reaction. However, poly(arylene vinylene)s are not the only class of polymers which are, suitable for use in optical devices. Other aryl-containing polymers may be useful and one route generally useful in the production of conjugated polymers is the Suzuki reaction (Synthetic Communications 11(7), 513, 1981). This reaction involves the use of a palladium-based catalyst, an aqueous alkaline carbonate or bicarbonate inorganic base and a solvent for the reactants and possibly the polymer product. The monomer reactants are typically a diboronic acid or diboronate monomer and a dibromo monomer.

U.S. Pat. No. 5,777,070 is directed to attempts to improve the Suzuki reaction to form conjugated polymers from aromatic monomers. U.S. Pat. No. 5,777,070 indicates that such reactions require as a solvent a non-polar solvent such as toluene. However, such non-polar solvents are acknowledged to slow down the rate of reaction. In order to overcome this disadvantage, U.S. Pat. No. 5,777,070 proposes the use of a phase-transfer catalyst such as tricaprylmethyl ammonium chloride sold under the registered trade mark Alquat to increase the rate of reaction. Accordingly, the reaction mixture contains an iorganic solvent such as toluene, an aqueous solution of an inorganic base such as sodium bicarbonate, a catalytic amount of a palladium complex and a catalytic amount of the phase transfer catalyst.

The inventors of the present invention have identified a number of drawbacks with the process described in U.S. Pat. No. 5,777,070. Firstly, the reaction is very slow; reaction times are typically of the order of 18 hours in order to produce a polymer having a molecular weight of the desired order. Discolouration of the polymer product and decomposition of the catalyst become concerns with such long reaction times. Secondly, the reproducibility of the reaction is somewhat poor. The monomer ratio is generally used in the case of copolymerization to control the molecular weight of the product polymer. However, the present inventors have noticed that the peak molecular weight of polymers produced according to the method disclosed in U.S. Pat. No. 5,777,070 vary considerably from reaction to reaction even when the starting monomer ratio is the same. Experiments conducted by the inventors of the present invention have shown that the peak molecular weight of the product polymer can vary by as much as about 100,000 for the same starting monomer ratio. Thirdly, the inventors of the present invention have also noticed that significant foaming is observed and that side products are produced which complex strongly to the walls of the reaction vessel, when a glass reaction vessel is used. These are difficult to remove, and the reaction thus requires the use of specialized reaction vessels. The above problems also make this a very difficult and expensive process to scale up.

The present invention aims to overcome at least some of the drawbacks mentioned above.

SUMMARY OF THE INVENTION

According to a first aspect of the present invention, there is provided a process for preparing a conjugated polymer, which comprises polymerizing in a reaction mixture (a) an aromatic monomer having at least two boron derivative functional groups selected from a boronic acid group, a boronic ester group and a borane group, and an aromatic monomer having at least two reactive halide functional groups; or (b) an aromatic monomer having one reactive halide functional group and one boron derivative functional group selected from a boronic acid group, a boronic ester group and a borane group, wherein the reaction mixture comprises a catalytic amount of a catalyst suitable for catalysing the polymerisation of the aromatic monomers, and an organic base in an amount sufficient to convert the boron derivative functional groups into $-B(X)_3^-$ anionic groups, wherein X is independently selected from the group consisting of F and OH.

The polymerisation proceeds by the coupling of the monomers via elimination of a reactive halide group and a boronate anionic group ($-B(X)_3^-$).

According to one embodiment of the invention, the conversion of the boron-derivative functional groups to the boronate anionic groups ($-B(X)_3^-$) by the organic base to form a salt having an organic cation is carried out under non-polymerisation conditions prior to polymerisation.

The boronate anionic group has the formula $-B(OH)_nF_m^-$, wherein n+m=3 and n and m are each 0, 1, 2 or 3. The boronate anionic group is preferably a $-B(OH)_3^-$ group. However, the reaction may also proceed, for example, via a $-B(OH)_2F^-$ anionic group using, for example, a tetraalkylammonium fluoride as the organic base.

The term conjugated polymer refers to either a fully conjugated polymer i.e. a polymer which is conjugated along the full length of its chain, or a partially conjugated polymer i.e. a polymer which contains conjugated segments together with non-conjugated segments.

The term aromatic monomer refers to any monomer which has the respective functional groups directly substituted on one or more aromatic rings. In the case of monomers having more than one aromatic ring, the functional groups can be substituted on either the same or different aromatic rings. Examples of suitable types of monomers include, but are not limited to, arylenes, heterocylic aromatic monomers, and fused aromatic systems such as biphenylenes, naphthalenes and fluorenes. Each monomer preferably comprises an arylene, a heteroarylene, a triarylamine, or a bisarylene vinylene. Each aromatic group within the monomer may be substituted or unsubstituted. Particularly preferred types of monomers include dialkylphenylenes, dialkoxy phenylenes, substituted and non-substituted thiophenes and benzothiadiazoles, and dialkylfluorenes such as 9,9-di-n-octylfluorenes. One or more of the monomers could also be a pre-formed oligomeric or polymeric chain comprising several smaller units with toe necessary functional groups provided at the desired positions on the chain.

It is also envisaged that under the appropriate reaction conditions, this invention could also be extended to the use of monomers in which some or all of the functional groups are not directly substituted on an aromatic ring, in particular to other kinds of unsaturated monomers.

Monomers particularly useful in the present invention include those which may be polymerised to form a semi-conductive conjugated polymer such as a semiconductive conjugated polymer for use in an optical device such as an electroluminescent device. Such polymers may be used in an emissive layer or as a hole transport or electron transport polymer. Luminescent polymers are particularly useful in such devices. The conjugated polymer may be fully or partially conjugated, perhaps containing conjugated segments and way be a homopolymer, a copolymer or an oligomer, and may be a linear or a branched chain polymer such as a dendrimer.

As described above, the monomers must each have the appropriate functional groups for the Suzuki reaction. In one arrangement, a first reactive dihalide monomer is polymerised with a second monomer having two boron derivative functional groups. In this arrangement the first and the second monomers may be the same or different. Where the monomers are the same, a homopolymer is produced. Where the monomers are different, a copolymer is produced. In a second arrangement, a monomer having a boron derivative functional group and a reactive halide functional group is polymerised to form a homopolymer. It is also possible to form copolymers from this second arrangement simply by polymerising together two or more different types of monomers each containing both functionalities.

Preferably, the reactive halide functional group on the reactive dihalide monomer or the monomer having the reactive halide functional group is Br or I although it is possible to use instead groups such as chlorine, triflate ($CF_3SO_3^-$), tosylate and mesylate.

With respect to the boron-derivative functional groups, the boronic acid group is represented by $—B(OH)_2$; the boronic ester group is preferably $—B(OR^1)(OR^2)$ or $—B(OR^5O)$ and the borane group is preferably $—BR^3R^4$, wherein $R^1$ is a substituted or non-substituted $C_1–C_6$ alkyl group and $R^2$ is H or a substituted or non-substituted $C_1–C_6$ alkyl group; $R^3$ and $R^4$ are each independently substituted or non-substituted $C_1–C_6$ alkyl groups, and $R^5$ is a substituted or non-substituted divalent hydrocarbon radical resulting in a 5 or 6 membered ester ring. Examples of suitable groups as $R^5$ include substituted or non-substituted $C_2$ or $C_3$ alkylene groups, or substituted or non-substituted ortho- or meta-phenylene groups.

Suitable boronic ester groups include, for example, the products of esterification of the corresponding boronic acid group with monovalent $C_1–C_6$ alcohols, ethane diols such as pinacol, propane diols or ortho aromatic diols such as 1,2-dihydroxybenzene.

The term "organic base" includes sources of hydroxyl ions and Lewis bases such as those which create a source of hydroxyl ions in combination with water. The organic base should be soluble in an organic solvent and/or an aqueous solvent. It is preferable to deliver the organic base in the form of an aqueous solution thereof, as this is effective at hydrolysing boronic ester or borane groups to the corresponding boronic acid groups and then converting the boronic acid groups to boronate anionic groups.

A single organic base or a mixture of different organic bases may be used.

Examples of organic bases include alkyl ammonium hydroxides, alkyl ammonium carbonates, alkyl ammonium biscarbonates, alkylammonium borates, 1,5-diazabicyclo[4.3.0]non-5-ene (DBN), 1,6-diazabicyclo[5.4.0]undec-7-ene (DBU), 1,4-diazabicyclo[2.2.2]octane (DABCO), dimethylaminopyridine (DMAP), pyridine, trialkylamines and alkylammonium fluorides such as tetraalkylammonium fluorides.

The organic base used in the method of the present invention is preferably a tetraalkyl ammonium hydroxide such as tetramethyl ammonium hydroxide, tetraethyl ammonium hydroxide or tetra-n-propyl ammonium hydroxide.

In another preferred embodiment of the present invention, a tetraalkyl ammonium carbonate or a tetraalkyl ammonium bicarbonate is used as the organic base. Other preferred bases are tetraalkylammonium borates, particularly, tetraethylammonium borate. These bases are particularly useful for reducing monomer degradation.

The most suitable organic base for any given system will depend on the nature of the monomers and solvent system employed. For example, in the case of the preparation of polyfluorenes from the boronic ester using toluene as a solvent, a base selected from the group of tetramethyl ammonium hydroxide, tetraethyl ammonium hydroxide or tetraisopropyl ammonium hydroxide is particularly preferred, with tetraethyl ammonium hydroxide being the most preferred of these organic bases.

The quantity of the base will depend on various factors such as the type of particular base used and the type of boron derivative functional group used. However, it has to be present in a sufficient quantity to convert the boron derivative functional group into the corresponding $—B(X)_3^-$ anionic group, which is the reactive species which is eliminated with the reactive halide functional group to effect polymerisation. In the case that the boron-derivative group is a boronic ester or a borane, the organic base should preferably be used in the form of an aqueous solution to provide sufficient water to hydrolyze the boronic ester or borane groups to the corresponding boronic acid groups and convert the boronic acid groups into boronate anionic groups.

The use of one equivalent of organic base per boron-derivative functional group has been found to give fair degrees of polymerisation over a relatively long period of time. Preferably, at least 1.5 molar equivalents, further preferably at least 2 molar equivalents, of the organic base per boron-derivative functional group are used. For example, molecular weights over 200,000 have been obtained in a relatively short period of tine using 2.26 mole equivalents of organic base per boron-derivative functional group.

The number of equivalents is defined by the functionality of the base multiplied by the molar ratio of base to boron-derivative functional groups.

It is preferable that the reaction mixture includes a solvent in which the conjugated polymer is soluble. For example, in the case of polyfluorenes, non-polar aromatic solvents such as anisole, benzene, ethylbenzene, mesitylene, xylene, and particularly toluene are preferred. It is also preferable that the reaction mixture includes a solvent in which the organic cation boronate salt produced by the reaction of the organic base with the boron-derivative functional groups, is soluble.

In the case that the boron-derivative functional group is a boronic ester or borane group, the reaction mixture should include sufficient water to hydrolyze the boronic ester or borane group to the corresponding boronic acid group. The organic base, such as a tetraalkylammonium hydroxide or tetraalkyl ammonium carbonate or bicarbonate is preferably added to the reaction mixture in the form of an aqueous solution to thereby provide sufficient water to hydrolyze the boronic ester or borane groups to the corresponding boronic acid groups. According to one possible variation, it is envisaged that the alkyl ammonium hydroxide may alternatively be added in the form of a hydrated salt thereof such as the trihydrate.

It is preferable to carry out the polymerisation in a single liquid phase by using an organic solvent or solvent mixture in which all the reaction components, i.e. the boronate salt produced by the reaction of the organic base with the boron-derivative functional groups and the dihalide monomers where applicable, are soluble, and with which water present for hydrolysis of boronic ester groups or borane groups is miscible.

In ore embodiment, the reaction mixture further comprises an aqueous solution of an inorganic base, preferably an inorganic base which does not include alkali metal ions, such as $NH_4OH$. This is preferred from the point of view of producing polymers of particularly high molecular weight.

The catalyst used in the method of the present invention is preferably a palladium catalyst. The palladium catalyst may be a Pd(O) complex or a Pd(II) salt. The Pd(O) complex is preferred, a $Pd(Ph_3P)_4$ catalyst being particularly preferred. Typically, the amount of palladium catalyst in the reaction mixture is 0.01 to 1 mol. %, preferably about 0.15 mol. %, based on the total number of moles of monomers used.

The inventors of the present invention have unexpectedly found that by conducting the reaction using an organic base rather an inorganic base as in U.S. Pat. No. 5,777,070, the polymerization can be carried out with faster reaction times and with better reproducibility. They have also found that the use of an organic base eliminates the problem of foaming and the problem of side-products becoming strongly complexed to the walls of the reaction vessel, whereby the need to utilize specialized reaction vessels is eliminated. In addition, the fact that alkali carbonates or alkali bicarbonates are not required for the reaction also has the additional advantage that it eliminates the need for a final purification step to remove alkali metal contaminants, which would otherwise be required to avoid such contaminants detrimentally affecting the performance of the polymer material in many applications. Furthermore, the present inventors have found surprisingly that polymers prepared by this route have lower residual levels of palladium compared to polymers prepared by prior art processes. This is particularly important in the case that the polymer is to be used in a light-emitting device, since the presence of palladium is believed to have a detrimental effect on the optical performance of the device.

Furthermore, in the process of the present invention, the molecular weights grow gradually with time in these very controlled polymerisations. This has the advantage that repeatable (consistent) and desired molecular weights can be achieved by stopping the reaction at the appropriate stage.

In a fourth aspect, the present invention provides a process for the production of an optical device or a component for an optical device. The process comprises providing a substrate and producing a polymer in accordance with the process as described above, whereby the polymer is supported by the substrate. The polymer may be supported by the substrate directly, for example where a polymer film is deposited or formed on the substrate, typically a transparent substrate. Alternatively, the polymer may be supported by the substrate indirectly where one or more intervening layers between the substrate and the polymer are provided. The optical device may comprise a luminescent device such as an electroluminescent device in which the polymer is disposed between a cathode and an anode. Where the polymer is an emissive layer, a hole transport layer may be provided between the anode and the substrate and an electron transport layer may be provided between the polymer and the cathode.

BRIEF DESCRIPTION OF THE DRAWINGS

The present invention will now be described in further detail, by way of example only, with reference to the accompanying drawings, in which.

DETAILED DESCRIPTION

Figure 1:
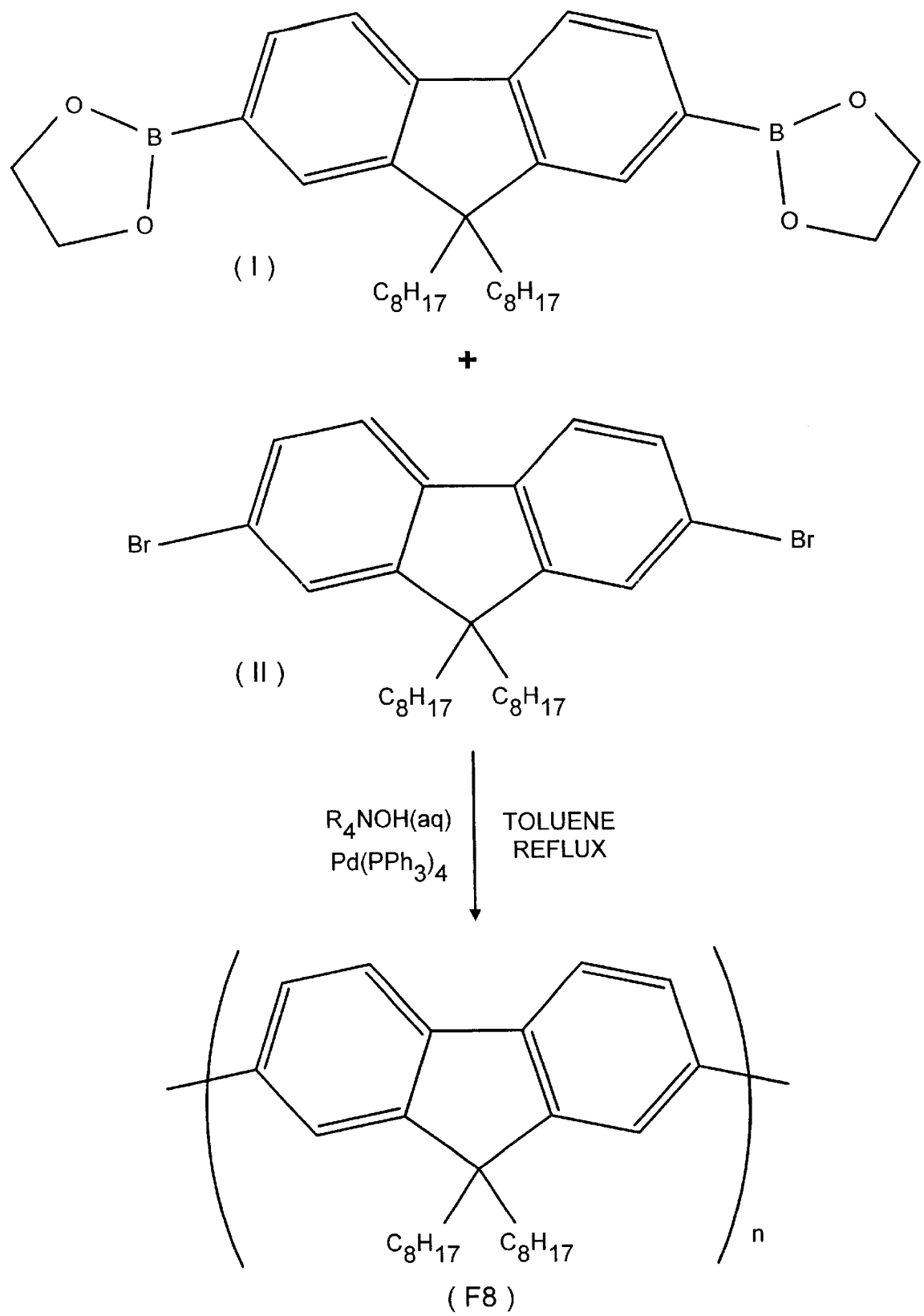
FIG. 1 shows a reaction scheme in accordance with the invention.

FIG. 1 illustrates one possible route for providing poly 2,7(9,9-di-n-octylfluorene) (F8 comprising a chain of di-n-octyl fluorene repeating units. A 2,7(9,9-di-n-octylfluorene) diboronate (I) is reacted with a corresponding 2,7-dibromo-(9,9-di-n-octylfluorene) (II) in toluene in the presence of a palladium catalyst such as $Pd(PPh_3)_4$ and an organic base such as a tetraalkyl ammonium hydroxide, tetraalkyl ammonium carbonate or tetraalkyl ammonium bicarbonate to produce polymer F8.

In an alternative embodiment of the present invention, this polymer can be produced by, for example, the homopolymerization of 2-bromo-(9,9-di-n-octylfluorene)-7-ethylenylboronate in toluene in the presence of a palladium catalyst and an organic base.

EXAMPLE 1

Polymer F8 was produced according to the following method. A three-necked 500 ml round bottomed flask fitted with a glass stirring rod attached to an electrical mechanical stirrer, a Teflon stirring blade, and a reflux condensor (connected to a nitrogen line) was charged with 9,9dioctylfluorene-2,7-di(ethylenylboronate) (4.773 g, 9.0 mmol), 2,7-dibromo-9,9'-dioctylfluorene (4,936 g, 9.0 mmol), tetrakis-(triphenylphosphine)palladium (31.2 mg, 0.027 mmol) and toluene (90 ml). The solution was stirred under nitrogen at room temperature for approximately ten minutes. An aqueous solution of tetraethyl ammonium hydroxide (30 ml, 20% wt/vol.) was added to the stirring mixture at room temperature.

The stirring mixture was heated to and maintained at reflux (115° C. oil bath temperature) for approximately two hours. Bromobenzene (1–2 ml) was added to the mixture, which was allowed to stir at reflux for a further hour before adding phenyl bozonic acid (1.5–2.0 g), after which the mixture was allowed to stir at reflux for one hour.

The mixture was allowed to cool to room temperature and poured slowly into 4 litres of methanol to precipitate the polymer. The polymer/methanol mixture was then filtered. The polymer isolated by filtration was then further reprecipitated into methanol from toluene solution.

The polymer obtained by this method had a peak molecular weight of 204,000. This and other molecular weights given below were measured using the Polymer Labs GPC system incorporating an LC1120 isocratic pump and ERC-7515A Refractive Index Detector. The solvent used was THF at a flow rate of 1 mL/min, and the temperature was controlled at 35° C. The column type was PL mixed (*2, 30 cm) calibrated using PL 600-500000 polystyrene standards.

EXAMPLE 2

Polymer F8 was produced in exactly the same way as in Example 1 except that the aqueous solution of tetraethyl ammonium hydroxide was added dropwise. The polymer obtained had a peak molecular weight of 229,000.

EXAMPLE 3

Polymer F8 was produced in exactly the same way as, in Example 1 except that the reaction was carried out at half-scale in a 250 ml flask. The polymer obtained had a peak molecular weight of 222,000.

EXAMPLE 4

Polymer F8 was produced in exactly the same way as in Example 1 except that an aqueous solution of ammonium hydroxide (10.45 ml ammonium hydroxide made up to 20 ml with water) was further added to the, monomer and toluene mixture prior to stirring under nitrogen at room temperature for ten minutes. No reaction was observed until the aqueous solution of tetraethyl ammonium hydroxide was added. The polymer obtained had a peak molecular weight of 373,650.

EXAMPLE 5

Polymer F8 was produced in exactly the same manner as in Example 1 except that an aqueous solution of an identical molar quantity of tetramethyl ammonium hydroxide was used instead of the aqueous solution of tetraethyl ammonium hydroxide. The polymer obtained had a peak molecular weight of 150,500.

EXAMPLE 6

Polymer F8 was produced in exactly the same way as in Example 1 except that an aqueous solution of an identical molar quantity of tetrapropyl ammonium hydroxide was used instead of the aqueous solution of tetraethyl ammonium hydroxide. The polymer obtained had a peak molecular weight of 142,000.

EXAMPLE 7

Figure 3:
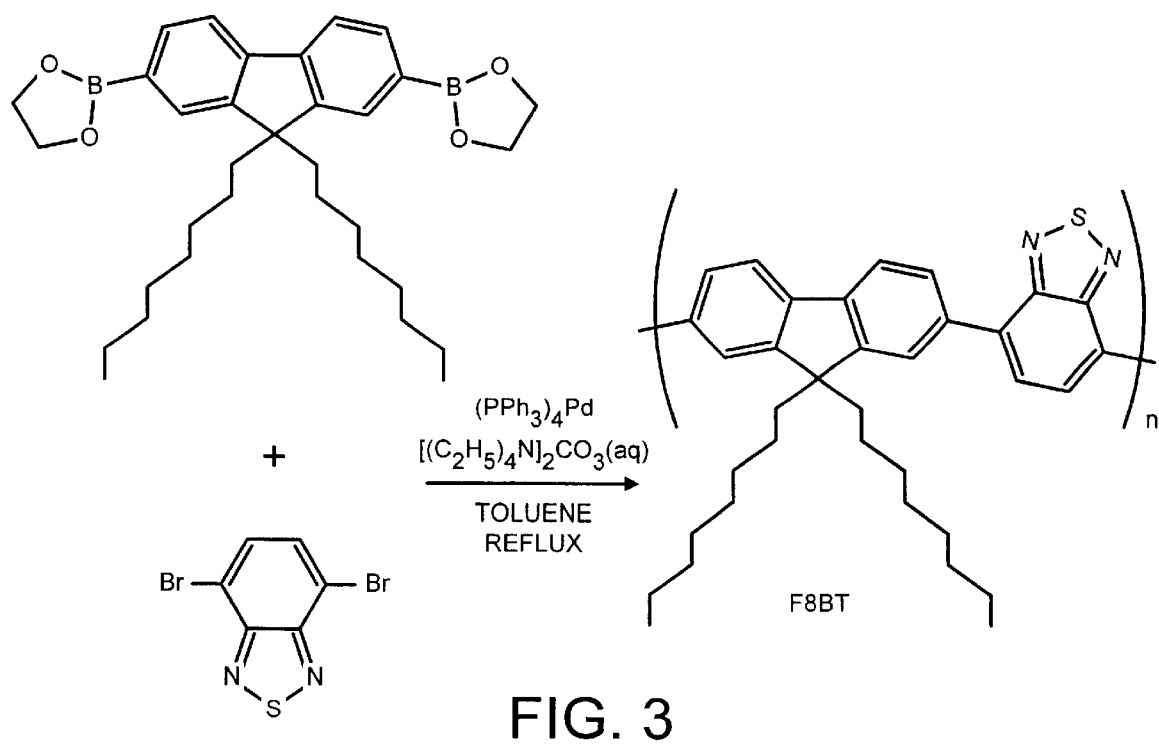
FIG. 3 shows another reaction scheme in accordance with the present invention.

The reaction scheme for the synthesis of FBST polymer using Bis(tetraethylammonium)carbonate as base is shown in FIG. 3.

A 500 ml reaction vessel was charged with 9,9-dioctylfluorene-2,7-diethylenyl (4.773 g, 9.0 mmol.), 2-7-dibromobenzothiadiazole (2.6449 g 9.0 mmol, tetrakistriph-enylphosphine palladium 31.2 mg, and toluene 100 ml. The mixture was stirred at room temperature for 10 minutes under nitrogen. Bis(tetraethylammonium)carbonate (13.0 g) dissolved in 20 ml of de-ionised water was then added to the mixture, which was then allowed to stir at room temperature under flow of nitrogen for 20 minutes.

The reaction mixture was heated to and maintained at reflux under nitrogen for up to 18 hours (typically left overnight). During this time the reaction mixture was stirred (setting rate 2–3) under an atmosphere of nitrogen.

Bromrobenzene (1 ml) was then added and the reaction mixture allowed to stir at reflux for 2 hours, after which phenyl boronic acid was added (2 g) and the reaction mixture was allowed to stir at reflux for a further 2 hours.

The mixture was allowed to cool to room temperature and poured into 4 l of methanol to precipitate the polymer. The polymer/methanol mixture was then filtered and the polymer was allowed to air dry on the Buchner funnel for five minutes. Aluminium foil was used to cover the top of the Buchner funnel to minimise light exposure.

After purification, the final yield was ~3.05 g, 64%. The peak molecular weight was found to be 175,000 (Mp) as determined by GPC.

EXAMPLE 8

A further synthesis was carried out in accordance with the synthesis described in Example 7 except that, in this particular case a mixed solvent system was used (THF/toluene) (~50:50). The moleculart weight obtained was ~350,000 (Mp).

EXAMPLE 9

9,9-di-n-octylfluorene-2,7-di(ethyleneboronate), 2,7-dibromo-9,9-di-n-octylfluorene and a palladium catalyst such as tetrakis(triphenylphosphine)palladium are dissolved in tetrahydrofuran (THF). To this is added two equivalents of a tetraalkylammonium hydroxide as an aqueous solution of concentration at least 20% by weight. The mixture is stirred at room temperature under a flow of nitrogen for 20 min. During this time, the tetralkylammonium disalt shown as (1) in FIG. 3 is formed and dissolves in the THF with the other components to give a clear single liquid phase. The reaction is heated to the reflux temperature of THF (66° C.) during which time the solution viscosity increases as polymer molecular weight increases. The reaction is usually complete within two hours.

As demonstrated above, particularly good results have been achieved in this polymerisation by using a polar organic solvent in which the boronate salt and the dihalide monomers are soluble and which is miscible with water (tetrahydrofuran) to provide a single phase reaction mixture. The polymerisation can be carried out at a relatively low temperature and in a relatively short period of time. Furthermore, relatively high molecular weights can be achieved. The use of lower reaction temperatures and shorter reaction times has the added advantage that there is little if any palladium catalyst decomposition.

EXAMPLE 10

Figure 4:
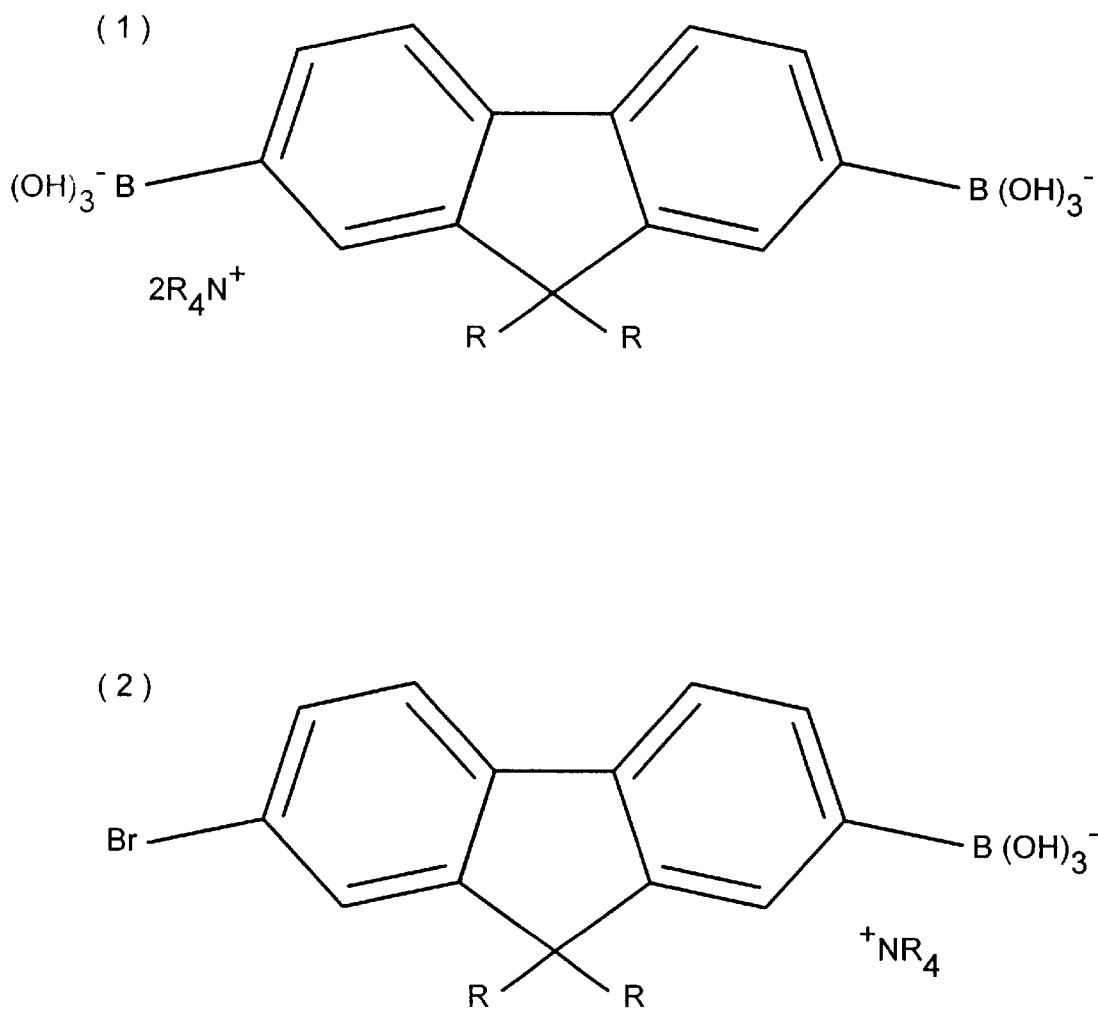
FIG. 4 shows examples of the boronate anions by which the polymerisation proceeds.

9,9-di-n-octylfluorene-2,7-di(ethyleneboronate), 2,7-dibromo-9,9-di-n-octylfluorene and a palladium catalyst such as tetrakis(triphenylphosphine)palladium are dissolved in a mixture of toluene and THF (e.g. 1:1 mixture). To this is added two equivalents of a tetraalkylammonium hydroxide as an aqueous solution of concentration at least 20% by weight. The mixture is stirred at room temperature under a flow of nitrogen for 20 min. During this time, a tetraalkyl ammonium disalt of the kind shown as (1) in FIG. 4 is formed as a white solid precipitate suspended in a single liquid phase. The reaction is heated to the reflux temperature of THF (66° C.) during which time the solution viscosity increases as polymer molecular weight increases. The reaction is usually complete within two hours.

As demonstrated above, this polymerisation can also be carried out in mixtures of water-miscible organic solvents such as THF and non water-miscible non-polar solvents such as toluene. Although the disalt tends to precipitate upon its in-situ formation to give a two phase system, the use of such a solvent mixture can be advantageous as some polymers are more compatible with a polar solvent such as THF whereas others are more soluble in non-polar solvents like toluene. The ability to use such solvent mixtures means that far more polymer types can be prepared without a risk of premature polymer precipitation during polymerisation.

EXAMPLE 11

9,9-di-n-octylfluorene-2,7-di(ethyleneboronate), 2,7-dibromo-9,9-di-n-octylfluorene and a palladium catalyst such as tetrakis(triphenylphosphine)palladium are dissolved in tetrahydrofuran (THF). To this is added two equivalents of a tetraalkylammonium hydroxide as an aqueous solution of concentration at least 20% by weight. The mixture is stirred at room temperature under a flow of nitrogen for 20 min. During this time, a tetraalkyl ammonium disalt of the kind shown as (1) in FIG. 4 is formed and dissolves in the THF with the other components to give a clear single liquid phase. All the components required for the polymerisation are present in the single liquid phase. The reaction is heated to the reflux temperature of THF (66° C.) during which time the solution viscosity increases as polymer molecular weight increases. After a certain amount of time (e.g. 1 hour) a proportion of a second organic solvent (e.g. toluene) is added and the reaction is continued at tine same temperature until further molecular weight increase is not observed (usually a total reaction time of two hours).

As demonstrated in this example, good results have also been achieved for this polymerisation by starting with a water-miscible polar organic solvent (THF) as in Example 9, and adding a second miscible organic solvent in which the polymer is soluble as the polymerisation proceeds.

The molecular weights grow gradually with time in these very controlled polymerisations. This has the advantage that repeatable (consistent) and desired molecular weights can be achieved by stopping the reaction at the appropriate stage.

Comparative Example 1

A three necked 250 ml round bottomed flask fitted with a glass stirring rod attached to an electrical mechanical stirrer (Heidolph RZH 2020), teflon stirring blade, reflux condenser (connected to a nitrogen line) was charged with 9,9-di octylfluorene-2,7-di(ethyleneboronate) (4.8779 g, 9.09 mmol, 98.8% purity by HPLC), 2,7-dibromo-9,9'-dioctylfluorene ((4.9360 g, 9.0 mmol) 100% purity by HPLC)) and toluene (90 ml). The solution was stirred under nitrogen for a 10 minutes and then 3.5 g of a surfactant solution (log of Aliquat 336 and Toluene 25 g) (2.5 mmol Aliquat 336) was added along with 20 ml of 2M solution of sodium carbonate. The mixture was then stirred at room temperature under nitrogen for a further 15 minutes. The catalyst, tetrakistriphenylphosphinepalladium 31.2 mg, was then added and the reaction mixture was heated and maintained at reflux for 18 hours.

During this time the reaction mixture was stirred (setting rate 2–3) under an atmosphere of nitrogen. The reaction mixture was observed after 2 hours, but there was no sign of any production of the polymer indicating the slowness of the reaction.

After 20 hours bromobenzene (1 ml) was added and the reaction mixture was allowed to stir at reflux for a further 20 hours.

The mixture was allowed to cool to room temperature and poured into 4 L of methanol to precipitate the polymer. The polymer/methanol mixture was then filtered and the polymer was allowed to air dry on the Buchner funnel for five minutes. Aluminium foil was used to cover the top of the Buchner funnel to minimise light exposure.

Polymer F8 was produced twice according to the above. The polymers obtained had a molecular weight of 170000 and 230000, respectively, showing relatively poor reproducibility.

Figure 2:
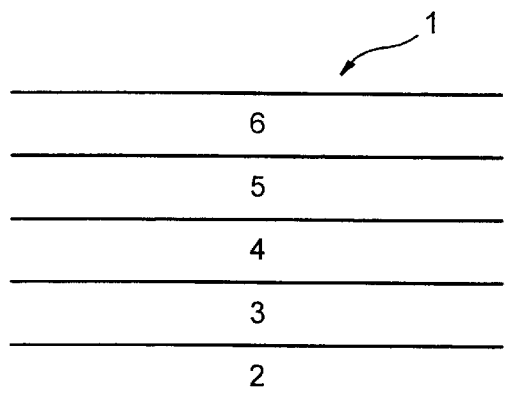
FIG. 2 shows a schematic representation of an optical device according to the invention.

FIG. 2 shows in a purely schematic way the order of layers in an electroluminescent device generally designated 1. Disposed on substrate 2, which is typically a transparent substrate such as glass, is anode 3 which may be a layer of transparent indium tin oxide. Adjacent layer 2 is hole transporting layer 3, which may be a polyethylene dioxythiophene, on which is disposed emissive layer 4, which may be a polymer according to the present invention. Layer 5 is an organic electron transport layer. Layer 6 is a cathode which may be a lithium aluminum layer.

What is claimed is:

1. A process for preparing a conjugated polymer, which comprises polymerizing in a reaction mixture (a) an aromatic monomer having at least two boron derivative functional groups selected from the group consisting of a boronic acid group, a boronic ester group and a borane group, and an aromatic monomer having at least two reactive halide functional groups; or (b) an aromatic monomer having one reactive halide functional group and one boron derivative functional group selected from the group consisting of a boronic acid group, a boronic ester group and a borane group, wherein the reaction mixture comprises a catalytic amount of a catalyst suitable for catalyzing the polymerisation of the aromatic monomers, and an organic base in an amount sufficient to convert the boron derivative functional groups into —$BX_3^-$ anionic groups, wherein X is independently selected from the group consisting of F and OH.

2. A process for preparing a conjugated polymer, which comprises preparing under non-polymerisation conditions an organic cation salt of an aromatic diboronate monomer by the reaction of an aromatic monomer having two boron-derivative functional groups with an organic base in an amount sufficient to convert the boron-derivative groups into boronate anionic groups (—$B(X)_3^-$) wherein X is independently selected form the group consisting of F and OH, and then polymerising the organic cation salt of the aromatic diboronate monomer with an aromatic monomer having two reactive halide functional groups in the presence of a catalyst suitable for catalysing the polymerisation by elimination of a halide functional group and a boronate anionic group.

3. A process for preparing a conjugated polymer, which comprises preparing under non-polymerisation conditions an organic cation salt of an aromatic boronate monomer having a reactive halide functional group by the reaction of an aromatic monomer having a boron-derivative functional group with an organic base in an amount sufficient to convert the boron-derivative group into a boronate anionic group (—$B(X)_3^-$) wherein X is independently selected from the group consisting of F and OH, and then polymerising the organic cation salt of the aromatic boronate monomer in the presence of a catalyst suitable for catalysing the polymerisation of the organic cation salt by elimination of a halide functional group and a boronate anionic group.

4. A process according to claim 1 wherein X is a hydroxyl group.

5. A process according to claim 1 wherein at least 1.5 equivalents of said organic base per boron-derivative functional group is provided in the reaction mixture.

6. A process according to claim 5 wherein at least two equivalents of said organic base per boron-derivative functional group is provided in the reaction mixture.

7. A process according to claim 1 wherein the organic base is selected from the group consisting of tetraalkylammonium carbonates, tetraalkylammmonium bicarbonates and alkylammonium hydroxides.

8. A process according to claim 7 wherein the organic base comprises R'R"R'"R""NOH, wherein R' is a $C_1$–$C_6$ alkyl group, and R", R'" and R"" are each independently hydrogen atoms or $C_1$–$C_6$ alkyl groups.

9. A process according to claim 8 wherein the organic base is selected from $(CH_3)_4NOH$, $(C_2H_5)_4NOH$ and $(C_3H_7)_4NOH$.

10. A process according to claim 1, wherein the organic base is a tetraalkylammonium carbonate or a tetraalkylammonium bicarbonate.

11. A process of according to claim 1 wherein the organic base is used in combination with an aqueous solution of an inorganic base.

12. A process according to claim 11 wherein the inorganic base is $NH_4OH$.

13. A process according to claim 1 wherein the reaction is carried out in the absence of alkali metal cations.

14. A process according to claim 1, wherein at least one of the aromatic monomers is a 2,7(9,9-di-n-octylfluorene).

15. A process according to claim 1 wherein a solvent which is miscible with water and in which the reactive components age soluble is used.

16. A process according to claim 1 wherein the catalyst is a palladium catalyst.

17. A process for producing a semiconductive conjugated polymer according to claim 1.

18. A process according to claim 17, wherein the semiconductive conjugated polymer is a luminescent polymer.

19. A process for the production of an optical device or a component for an optical device, which comprises providing a substrate and producing a polymer in accordance with the process of claim 1, whereby the polymer is supported by the substrate.

20. A process according to claim 19, wherein the optical device comprises an electroluminescent device.

* * * * *

UNITED STATES PATENT AND TRADEMARK OFFICE
CERTIFICATE OF CORRECTION

PATENT NO. : 6,353,072 B1
DATED : March 5, 2002
INVENTOR(S) : Towns et al.

It is certified that error appears in the above-identified patent and that said Letters Patent is hereby corrected as shown below:

Column 10,
Line 53, please delete "selected from the" and substitute therefore -- selected from the --

Column 12,
Line 12, please delete "components age soluble" and substitute therefore -- components are soluble --

Signed and Sealed this

Twenty-seventh Day of August, 2002

Attest:

Attesting Officer

JAMES E. ROGAN
Director of the United States Patent and Trademark Office